(12) United States Patent
Yamaguchi et al.

(10) Patent No.: US 10,348,179 B2
(45) Date of Patent: Jul. 9, 2019

(54) POWER SEMICONDUCTOR DEVICE (71) Applicant: Mitsubishi Electric Corporation, Tokyo (JP)

(72) Inventors: Kosuke Yamaguchi, Tokyo (JP); Tomofumi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/572,181

(22) PCT Filed: Aug. 20, 2015

(86) PCT No.: PCT/JP2015/073316
§ 371 (c)(1),
(2) Date: Nov. 7, 2017

(87) PCT Pub. No.: WO2017/029745
PCT Pub. Date: Feb. 23, 2017

(65) Prior Publication Data
US 2018/0131262 A1    May 10, 2018

(51) Int. Cl.
*H02M 1/00* (2006.01)
*H01L 23/28* (2006.01)
(Continued)

(52) U.S. Cl.
CPC .............. *H02M 1/00* (2013.01); *H01L 23/28* (2013.01); *H01L 23/49562* (2013.01);
(Continued)

(58) Field of Classification Search
CPC ....... G09G 3/20; H02M 7/003; H01R 31/065; H01R 13/6675; H05K 2201/10909;
(Continued)

(56) References Cited

U.S. PATENT DOCUMENTS 9,230,891 B2   1/2016 Zhang et al.
2006/0071289 A1   4/2006 Tanaka et al.
(Continued)

FOREIGN PATENT DOCUMENTS

JP   H07-014963 A   1/1995
JP   H07-078922 A   3/1995
(Continued)

OTHER PUBLICATIONS

International Search Report issued in PCT/JP2015/073316; dated Oct. 13, 2015.
(Continued)

*Primary Examiner* — Nguyen Tran
(74) *Attorney, Agent, or Firm* — Studebaker & Brackett PC (57) ABSTRACT

An inverter-control element operates with a power-supply potential supplied to an inverter-control-system power-supply terminal to output a signal for controlling an inverter switching element. A brake control element operates with a power-supply potential supplied to a brake-control-system power-supply terminal to output a signal for controlling a brake switching element. A first metal component includes a plurality of protrusions protruding from a sealing resin, is supported by the sealing resin with a portion embedded in the sealing resin, and is electrically connected to each of the inverter-control-system power-supply terminal and the brake-control-system power-supply terminal.

8 Claims, 7 Drawing Sheets

(51) Int. Cl.
*H02M 7/00* (2006.01)
*H01L 23/495* (2006.01)
*H01L 23/00* (2006.01)
*H02M 1/32* (2007.01)

(52) U.S. Cl.
CPC ........ *H01L 23/49575* (2013.01); *H01L 24/42* (2013.01); *H02M 7/003* (2013.01); *H01L 2224/0603* (2013.01); *H01L 2224/48137* (2013.01); *H01L 2224/48139* (2013.01); *H01L 2224/49111* (2013.01); *H01L 2224/49113* (2013.01); *H01L 2224/49171* (2013.01); *H02M 2001/0038* (2013.01); *H02M 2001/322* (2013.01)

(58) Field of Classification Search
CPC .................. H05K 1/184; H05K 1/165; H05K 2201/10651; H05K 2201/10659; H05K 2201/10666; H05K 2201/10893; H05K 2201/10916; H05K 2201/10946
See application file for complete search history.

(56) References Cited

U.S. PATENT DOCUMENTS

2013/0155745 A1* 6/2013 Tanaka .................. H02M 7/003
  363/131
2015/0084173 A1* 3/2015 Zhang ............... H01L 23/49575
  257/676

FOREIGN PATENT DOCUMENTS

| JP | 2004-319940 A | 11/2004 |
| JP | 2006-216989 A | 8/2006 |
| JP | 2015-065339 A | 4/2015 |

OTHER PUBLICATIONS

An Office Action; "Notice of Reasons for Rejection," issued by the Japanese Patent Office dated Oct. 24, 2017, which corresponds to Japanese Patent Application No. 2017-535206.
Notification of Transmittal of Copies of Translation of the International Preliminary Report on Patentability (Chapter I) and Translation of Written Opinion of the International Searching Authority; PCT/JP2015/073316; dated Mar. 1, 2018.

* cited by examiner

POWER SEMICONDUCTOR DEVICE

TECHNICAL FIELD

The present invention relates to a power semiconductor device, and particularly to a power semiconductor device including an inverter circuit and a brake circuit.

BACKGROUND ART

Japanese Patent Application Laid-Open No. 2015-65339 (Patent Document 1) discloses a converter-inverter-brake (CIB) power module including a converter circuit, an inverter circuit, and a brake circuit. This power module includes: a plurality of die pads; an inverter circuit element, a converter circuit element, a brake circuit element, and an integrated circuit mounted on the plurality of die pads; a plurality of leads connected via respective wires to the inverter circuit element, the converter circuit element, the brake circuit element, and the integrated circuit; and a sealing resin covering part of the plurality of leads, the inverter circuit element, the converter circuit element, the brake circuit element, and the integrated circuit, and not covering the remaining part of the plurality of leads. The sealing resin is formed by what is called transfer molding.

PRIOR-ART DOCUMENTS

Patent Documents

Patent Document 1: Japanese Patent Application Laid-Open No. 2015-65339

SUMMARY

Problems to be Solved by the Invention

According to the technique described in the patent application, the leads (metal portions) have been easily deformed when subjected to a force from a resin poured into a mold by the transfer molding. Consequently, the leads have been easily disarranged.

The present invention has been conceived to solve such problems, and has an object of providing a power semiconductor device in which a metal component can be disposed in a sealing resin with high accuracy.

Means to Solve the Problems

The power semiconductor device according to the present invention includes at least one inverter switching element, a brake switching element, at least one inverter-control element, a brake control element, a sealing resin, and a first metal component. The inverter switching element is a switching element included in an inverter circuit. The brake switching element is a switching element included in a brake circuit. The inverter-control element includes an inverter-control-system power-supply terminal, and operates with a power-supply potential supplied to the inverter-control-system power-supply terminal to output a signal for controlling the inverter switching element. The brake control element includes a brake-control-system power-supply terminal, and operates with a power-supply potential supplied to the brake-control-system power-supply terminal to output a signal for controlling the brake switching element. The sealing resin seals the inverter switching element, the brake switching element, the inverter-control element, and the brake control element. The first metal component includes a plurality of protrusions protruding from the sealing resin, is supported by the sealing resin with a portion embedded in the sealing resin, and is electrically connected to each of the inverter-control-system power-supply terminal and the brake-control-system power-supply terminal.

Effects of the Invention

According to the present invention, the first metal component is provided in common for electrical connection with the inverter-control-system power-supply terminal and the brake-control-system power-supply terminal. With a plurality of protrusions protruding from the sealing resin, the first metal component may be stably held by fixing these protrusions when the sealing resin is formed. Thus, the metal component can be disposed in the sealing resin with higher accuracy than the case where a plurality of metal components each having a single protrusion are provided for electrical connection with the inverter-control-system power-supply terminal and the brake-control-system power-supply terminal.

The objects, features, aspects and advantages of the present technique will become more apparent from the following detailed description and the accompanying drawings.

DESCRIPTION OF EMBODIMENTS

Embodiments according to the present invention will be hereafter described based on the drawings.

[Embodiment 1]
[Structure]

Figure 1:
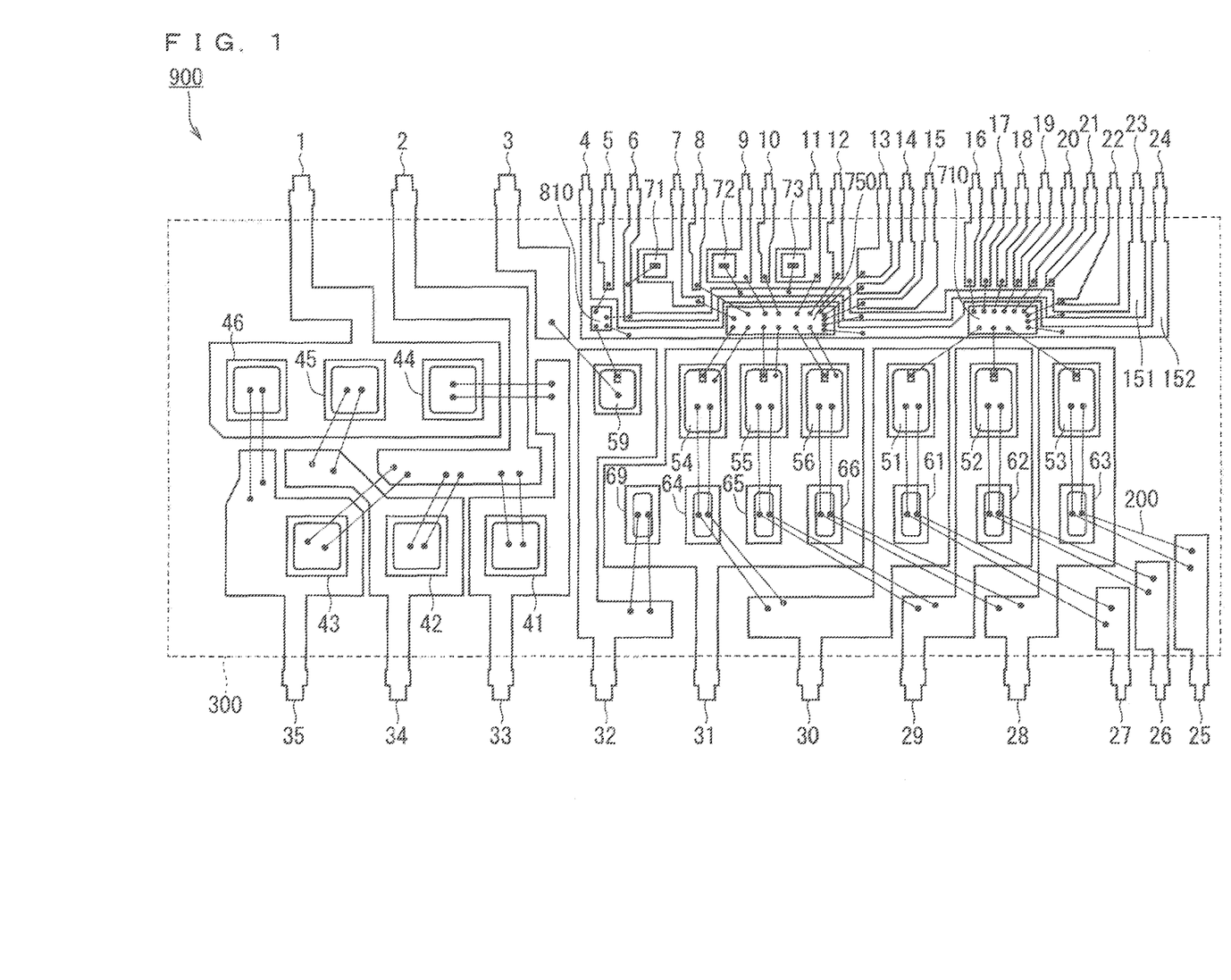
FIG. 1 is a plan view schematically illustrating a structure of a power semiconductor device according to Embodiment 1 of the present invention.
Figure 2:
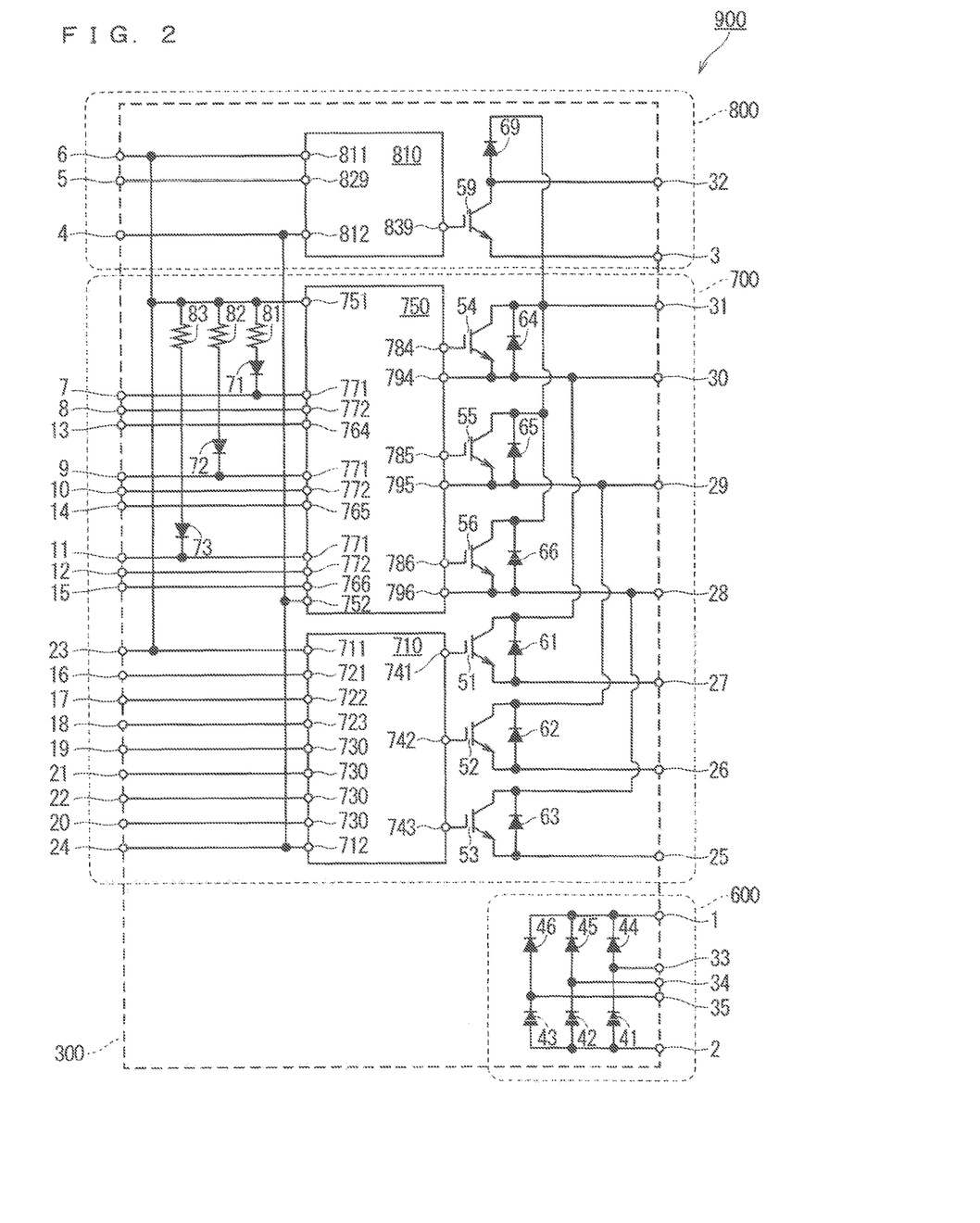
FIG. 2 is a circuit diagram schematically illustrating the structure of the power semiconductor device according to Embodiment 1 of the present invention.
Figure 3:
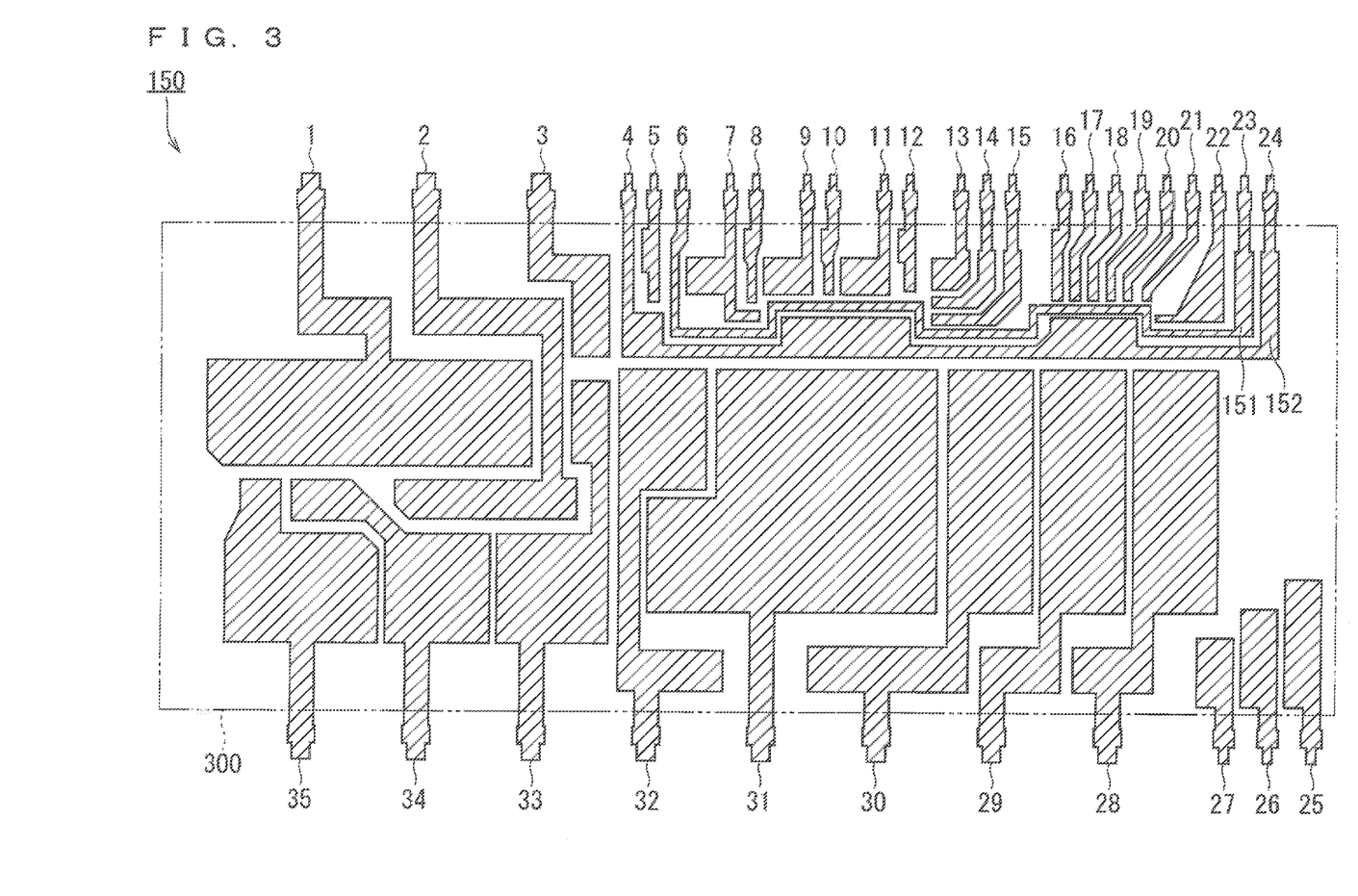
FIG. 3 is a plan view schematically illustrating a structure of metal portions in FIG. 1.

FIG. 1 is a plan view schematically illustrating a structure of an intelligent power module 900 (power semiconductor device) according to Embodiment 1. The dotted line in FIG. 1 indicates only an outer edge of a sealing resin 300. FIG. 2 is a circuit diagram schematically illustrating the structure of the intelligent power module 900. FIG. 3 is a plan view schematically illustrating a structure of metal components 150 of the intelligent power module 900 in the same view as FIG. 1. FIG. 3 is hatched to facilitate viewing of the drawing.

As illustrated in FIG. 2, the intelligent power module 900 includes a converter circuit 600, an inverter circuit 700, and a brake circuit 800 as a circuit structure. The intelligent power module 900 specifically includes a plurality of the metal components 150 (FIG. 3) functioning as leads and die pads, the sealing resin 300, bondwires 200, and a plurality of electrical parts mounted on the metal components 150 functioning as the die pads. The sealing resin 300 seals these electrical parts. The sealing resin 300 also partially seals the metal components 150. Exposed portions of the metal components 150, which are not sealed by the sealing resin 300, function as external terminals of the intelligent power module 900. The metal components 150 include a first metal component 151 partially sealed by the sealing resin 300 and functioning as a lead. The metal components 150 also include a second metal component 152 partially sealed by the sealing resin 300 and functioning as a lead and die pads.

The intelligent power module 900 includes converter diodes 41 to 46 as electrical parts included in the converter circuit 600. Exposed portions of the metal components 150 that are included in the converter circuit 600 constitute AC-input external terminals 33 to 35, a positive-output external terminal 1, and a negative-output external terminal 2. A converter bridge formed by the converter diodes 41 to 46 converts three-phase AC-voltages inputted to the AC-input external terminals 33 to 35 into DC-voltages outputted from the positive-output external terminal 1 and the negative-output external terminal 2.

The intelligent power module 900 includes, as electrical parts included in the inverter circuit 700, an inverter low voltage integrated circuit (LVIC) 710 (inverter-control element), an inverter high voltage integrated circuit (HVIC) 750 (inverter-control element), insulated gate bipolar transistors (IGBTs) 51 to 56 (inverter switching elements), free-wheeling diodes 61 to 66, bootstrap diodes 71 to 73, and bootstrap resistors 81 to 83. The inverter LVIC 710 and the inverter HVIC 750 are driving ICs for driving a low side and a high side of the inverter circuit 700, respectively. The inverter LVIC 710 and the inverter HVIC 750 are mounted on the second metal component 152 (FIG. 3) as die pads. The IGBT 51 and the free-wheeling diode 61 form one arm. The IGBTs 52 to 56 and the free-wheeling diodes 62 to 66, respectively, form additional five arms. The total six arms form a three-phase bridge circuit. Exposed portions of the metal components 150 that are included in the inverter circuit 700 constitute an inverter-unit-control power-supply external terminal 23, an inverter-unit-control ground external terminal 24, low-side control-input external terminals 16 to 18, high-side control-input external terminals 13 to 15, negative-connection external terminals 25 to 27, AC-output external terminals 28 to 30, a positive-input external terminal 31, and other external terminals 7 to 12 and 19 to 22.

The intelligent power module 900 includes, as electrical parts included in the brake circuit 800, a brake control IC 810 (brake control element), an IGBT 59 (brake switching element), and a diode 69. The brake control IC 810 is mounted on the second metal component 152 (FIG. 3) as a die pad. Exposed portions of the metal components 150 that are included in the brake circuit 800 constitute a brake-unit-control power-supply external terminal 6, a brake-unit-control ground external terminal 4, a brake control-input external terminal 5, a brake external terminal 32, and a brake ground external terminal 3.

The inverter LVIC 710 includes an LVIC inverter-control-system power-supply terminal 711 (inverter-control-system power-supply terminal), an LVIC inverter-control-system ground terminal 712 (inverter-control-system ground terminal), LVIC inverter-control-input terminals 721 to 723, LVIC inverter-control-output terminals 741 to 743, and other element terminals 730. A reference potential of a power-supply potential supplied to the LVIC inverter-control-system power-supply terminal 711 is supplied to the LVIC inverter-control-system ground terminal 712. The inverter LVIC 710 operates with the power-supply potential supplied to the LVIC inverter-control-system power-supply terminal 711 to output gate signals for controlling the IGBTs 51 to 53 (inverter switching elements) from the LVIC inverter-control-output terminals 741 to 743, respectively.

The inverter HVIC 750 includes an HVIC inverter-control-system power-supply terminal 751 (inverter-control-system power-supply terminal), an HVIC inverter-control-system ground terminal 752 (inverter-control-system ground terminal), HVIC inverter-control-input terminals 764 to 766, HVIC inverter-control-output terminals 784 to 786, offset-output terminals 794 to 796, driving-power-supply terminals 771, and driving-power-supply ground terminals 772. A reference potential of a power-supply potential supplied to the HVIC inverter-control-system power-supply terminal 751 is supplied to the HVIC inverter-control-system ground terminal 752. The inverter HVIC 750 operates with the power-supply potential supplied to the HVIC inverter-control-system power-supply terminal 751 to output gate signals for controlling the IGBTs 54 to 56 (inverter switching elements) from the HVIC inverter-control-output terminals 784 to 786, respectively.

The brake control IC 810 includes a brake-control-system power-supply terminal 811, a brake-control-system ground terminal 812, a brake control-input terminal 829, and a brake control-output terminal 839. A reference potential of a power-supply potential supplied to the brake-control-system power-supply terminal 811 is supplied to the brake-control-system ground terminal 812. The brake control IC 810 operates with the power-supply potential supplied to the brake-control-system power-supply terminal 811 to output a gate signal for controlling the IGBT 59 (brake switching element) from the brake control-output terminal 839.

The sealing resin 300 seals the IGBTs 51 to 56 and 59, the inverter LVIC 710, the inverter HVIC 750, and the brake control IC 810. The sealing resin 300 also partially seals the metal components 150.

The first metal component 151 is supported by the sealing resin 300 with a portion embedded in the sealing resin 300. The first metal component 151 is electrically connected to each of the LVIC inverter-control-system power-supply terminal 711, the HVIC inverter-control-system power-supply terminal 751, and the brake-control-system power-supply terminal 811. Specifically, the first metal component 151 is electrically connected, via the bondwire 200 within the sealing resin 300, to each of the LVIC inverter-control-system power-supply terminal 711, the HVIC inverter-control-system power-supply terminal 751, and the brake-control-system power-supply terminal 811. The first metal component 151 includes a plurality of protrusions protruding from the sealing resin 300 which constitute the inverter-unit-control power-supply external terminal 23 and the brake-unit-control power-supply external terminal 6.

The second metal component 152 is supported by the sealing resin 300 with a portion embedded in the sealing resin 300. The second metal component 152 is electrically connected to each of the LVIC inverter-control-system ground terminal 712, the HVIC inverter-control-system ground terminal 752, and the brake-control-system ground terminal 812. Specifically, the second metal component 152 is electrically connected, via the bondwire 200 within the sealing resin 300, to each of the LVIC inverter-control-system ground terminal 712, the HVIC inverter-control-system ground terminal 752, and the brake-control-system ground terminal 812. The second metal component 152 includes a plurality of protrusions protruding from the sealing resin 300 which constitute the inverter-unit-control ground external terminal 24 and the brake-unit-control ground external terminal 4.

The bondwires 200 are used to form wiring with the metal components 150 in the circuit illustrated in FIG. 2. The bondwires 200 include the bondwire 200 electrically connecting, to the first metal component 151, each of the LVIC inverter-control-system power-supply terminal 711, the HVIC inverter-control-system power-supply terminal 751, and the brake-control-system power-supply terminal 811. According to Embodiment 1, the first metal component 151 is only in contact with the sealing resin 300 the bondwires 200 in the sealing resin 300.

[Manufacturing Method]

Next, a method for manufacturing the intelligent power module 900 will be hereinafter described.

Figure 4:
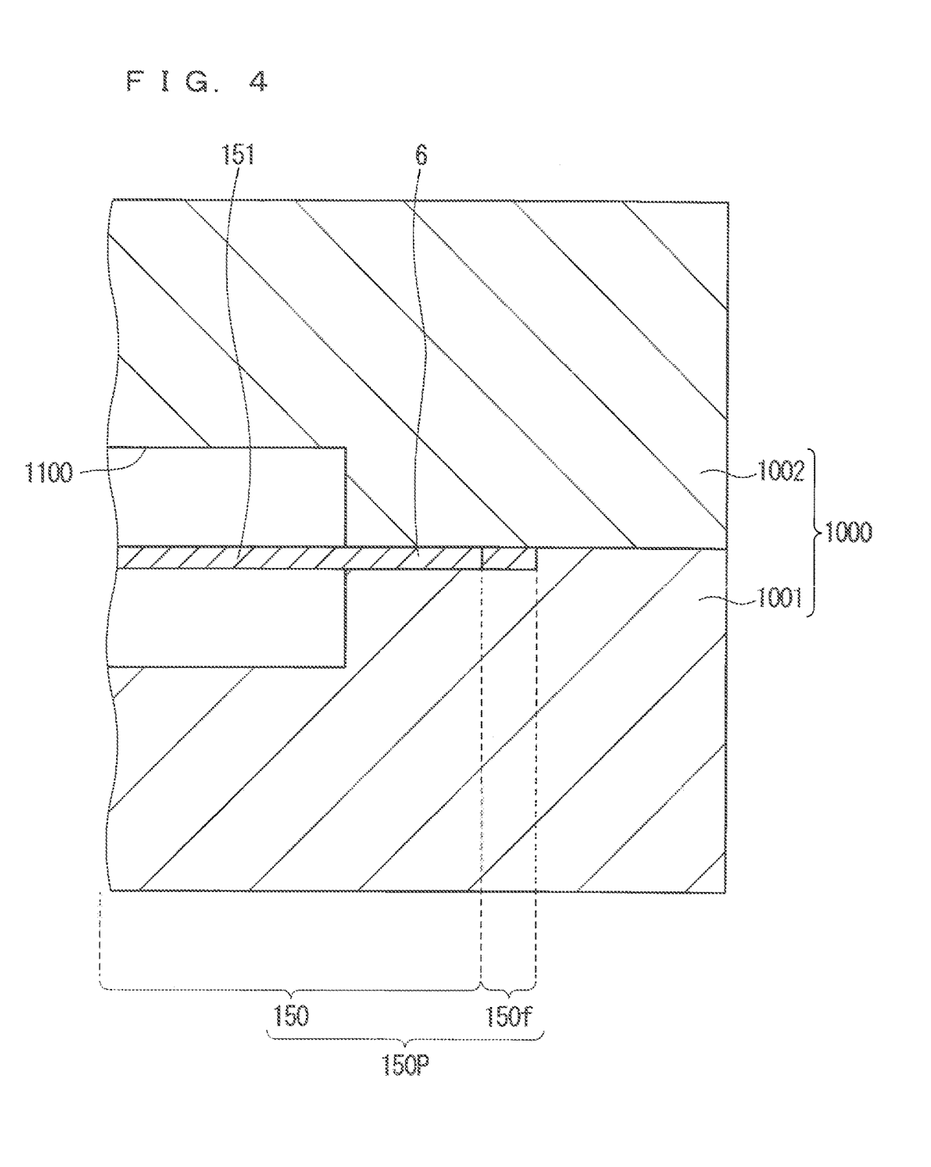
FIG. 4 is a partial sectional view schematically illustrating a process in a method for manufacturing the power semiconductor device according to Embodiment 1 of the present invention.

First, a flamed metal component 150P with a frame 150f (FIG. 4) connected to each of the metal components 150 is prepared. The flamed metal component 150P is to be ultimately the metal component 150 (FIG. 3). The aforementioned electrical parts are mounted on the metal component 150 in the flamed metal component 150P. The bondwires 200 are formed on the metal component 150 on which the electrical parts are mounted.

Then, a mold 1000 with a lower mold 1001 and an upper mold 1002 is prepared for transfer molding. The mold 1000 includes a cavity 1100 between the lower mold 1001 and the upper mold 1002.

Next, the metal components 150 are hung within the cavity 1100 by sandwiching, between the lower mold 1001 and the upper mold 1002, the frames 150f and portions to be ultimately external terminals of the metal components 150 in the flamed metal components 150P. Particularly, one end and the other end of the first metal component 151 are hung by fixing a portion to be the brake-unit-control power-supply external terminal 6 (FIG. 4) and a portion to be the inverter-unit-control power-supply external terminal 23 (not illustrated in FIG. 4) by the mold 1000.

Next, a resin is injected into the cavity 1100. The sealing resin 300 is formed accordingly. Here, the metal components 150 may be accidentally deformed when subjected to and caused by a force from the injected resin. Particularly, some of the metal components 150 hung within the cavity 1100 and supported by the mold 1000 at only one portion are easily deformed. Conversely, some of the metal components 150 supported by the mold 1000 at a plurality of portions are hardly deformed. The first metal component 151 is not only supported by the portion to be the brake-unit-control power-supply external terminal 6 (FIG. 4) but also by the portion to be the inverter-unit-control power-supply external terminal 23 (not illustrated in FIG. 4, see FIG. 3). Thus, the first metal component 151 is hardly deformed when the sealing resin 300 is transfer molded. Consequently, the first metal component 151 may be disposed in the sealing resin 300 with high accuracy.

Next, an intermediate product obtained by the transfer molding is taken out of the mold 1000. Then, the frames 150f are cut to be removed. The intelligent power module 900 is obtained accordingly.

[Advantages]

According to Embodiment 1, the first metal component 151 (FIG. 1) is provided in common for electrical connection with the LVIC inverter-control-system power-supply terminal 711, the HVIC inverter-control-system power-supply terminal 751, and the brake-control-system power-supply terminal 811 (FIG. 2). The first metal component 151 includes the brake-unit-control power-supply external terminal 6 and the inverter-unit-control power-supply external terminal 23 as the plurality of protrusions protruding from the sealing resin 300. In the transfer molding for forming the sealing resin 300 (FIG. 4), the first metal component 151 may be stably held by fixing these protrusions. Unlike the case where a plurality of metal components each having a single protrusion are provided for electrical connection with the LVIC inverter-control-system power-supply terminal 711, the HVIC inverter-control-system power-supply terminal 751, and the brake-control-system power-supply terminal 811, the first metal component 151 can be disposed in the sealing resin 300 with high accuracy as one of the metal components 150.

The first metal component 151 that is only in contact with the sealing resin 300 and the bondwires 200 in the sealing resin 300 is substantially held only by the protrusions of the first metal component 151 immediately before the sealing resin 300 is formed. Since external forces easily deform the bondwires 200, the bondwires 200 do not substantially contribute to the holding of the first metal component 151. Here, formation of the sealing resin 300 particularly requires preventing the first metal component 151 from being disarranged due to its deformation. According to Embodiment 1, such disarrangement can be effectively prevented as mentioned above.

Although the first metal component 151 is only in contact with the sealing resin 300 and the bondwires 200 in the sealing resin 300 in Embodiment 1, the first metal component 151 may be in contact with other structures, for example, a structure for improving thermal conductivity. A resin sheet with thermal conductivity higher than that of the sealing resin 300 may be used as such a structure. Since the rigidity of the resin sheet is relatively low, the resin sheet does not contribute much to stable disposition of the first metal component 151 in the transfer molding. Thus, use of the first metal component 151 capable of being disposed with high accuracy is more advantageous in such cases.

The second metal component 152 also includes a plurality of protrusions protruding from the sealing resin 300 similarly as the first metal component 151. Consequently, the second metal component 152 may also be disposed in the sealing resin 300 with high accuracy.

The brake-unit-control power-supply external terminal 6 and the inverter-unit-control power-supply external terminal 23 are short-circuited by the first metal component 151 in the sealing resin 300. Any one of the brake-unit-control power-supply external terminal 6 and the inverter-unit-control power-supply external terminal 23 can supply power to the inverter circuit 700 and the brake circuit 800 (FIG. 2) accordingly. In other words, mere connection to one external terminal enables the inverter circuit 700 and the brake circuit 800 (FIG. 2) to be supplied with power. Thus, it is possible to select whether the brake-unit-control power-supply external terminal 6 or the inverter-unit-control power-supply external terminal 23 is used in manufacturing a device (not illustrated) on which the intelligent power module 900 is to be mounted, to be suitable for the wiring around the intelligent power module 900 or arrangement of the parts. Consequently, the flexibility in designing the wiring around the intelligent power module 900 or the arrangement of the parts will be improved.

According to Embodiment 1, the first metal component 151 is used in common for electrical connection with each of the LVIC inverter-control-system power-supply terminal 711 in the inverter-control element 710 and the HVIC inverter-control-system power-supply terminal 751 in the inverter HVIC 750. This eliminates the need for providing metal components other than the first metal component 151 that is capable of being disposed in the sealing resin 300 with high accuracy and that functions as a metal component for electrical connection with each of the LVIC inverter-control-system power-supply terminal 711 in the inverter-control element 710 and the HVIC inverter-control-system power-supply terminal 751 in the inverter HVIC 750. Thus, even when the number of inverter-control elements is more than one, metal components can be disposed in the sealing resin 300 with high accuracy.

[Embodiment 2]

Figure 5:
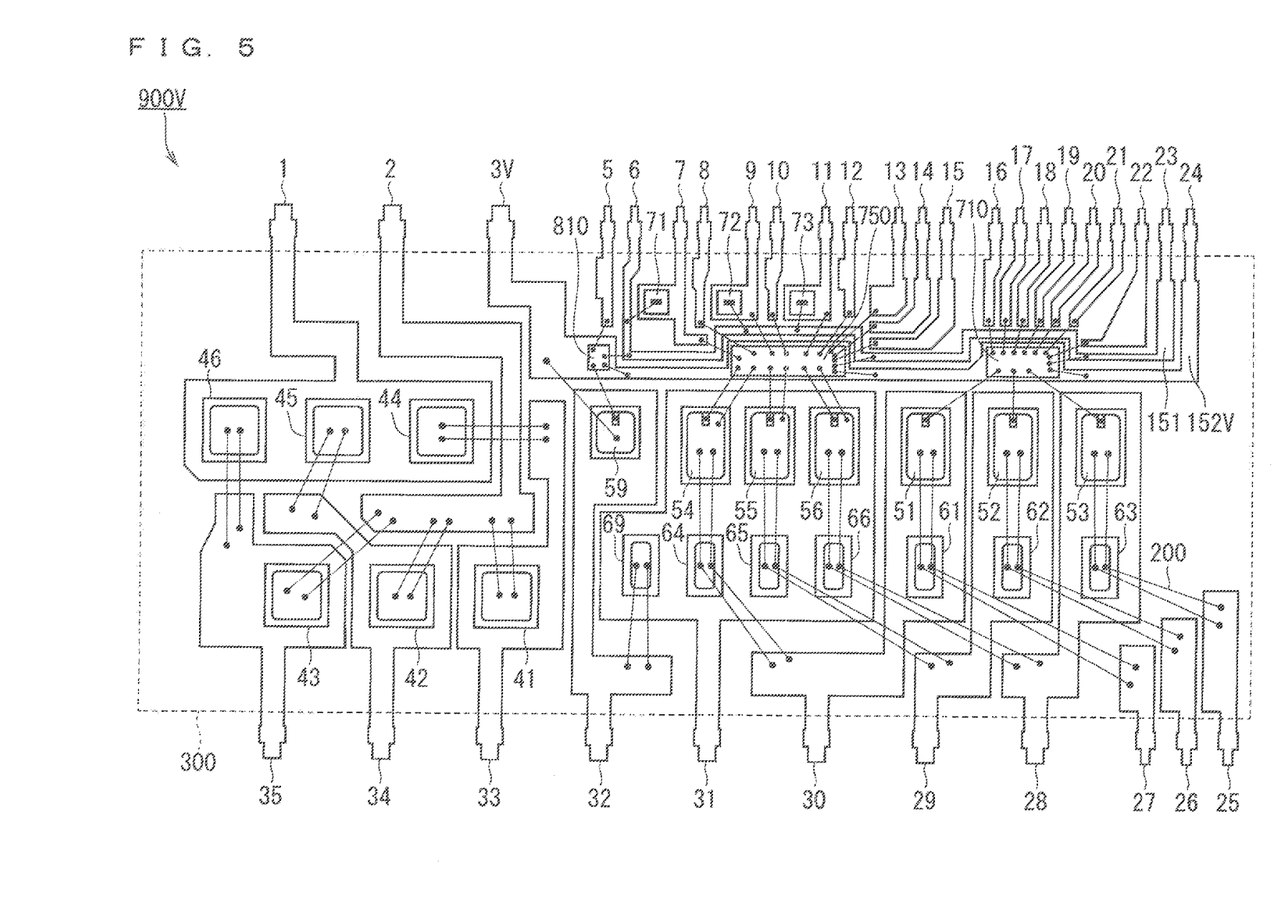
FIG. 5 is a plan view schematically illustrating a structure of a power semiconductor device according to Embodiment 2 of the present invention.
Figure 6:
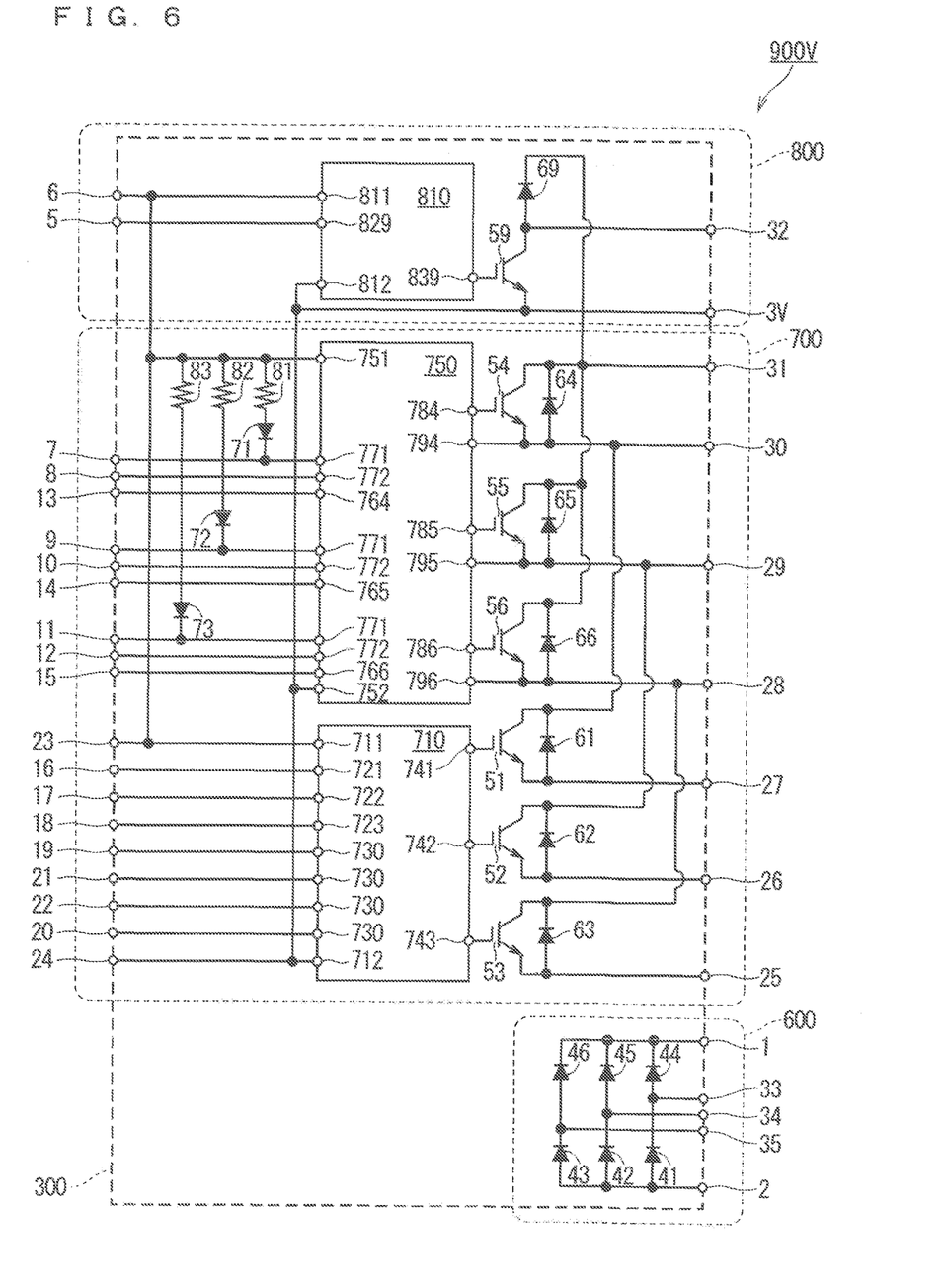
FIG. 6 is a circuit diagram schematically illustrating the structure of the power semiconductor device according to Embodiment 2 of the present invention.
Figure 7:
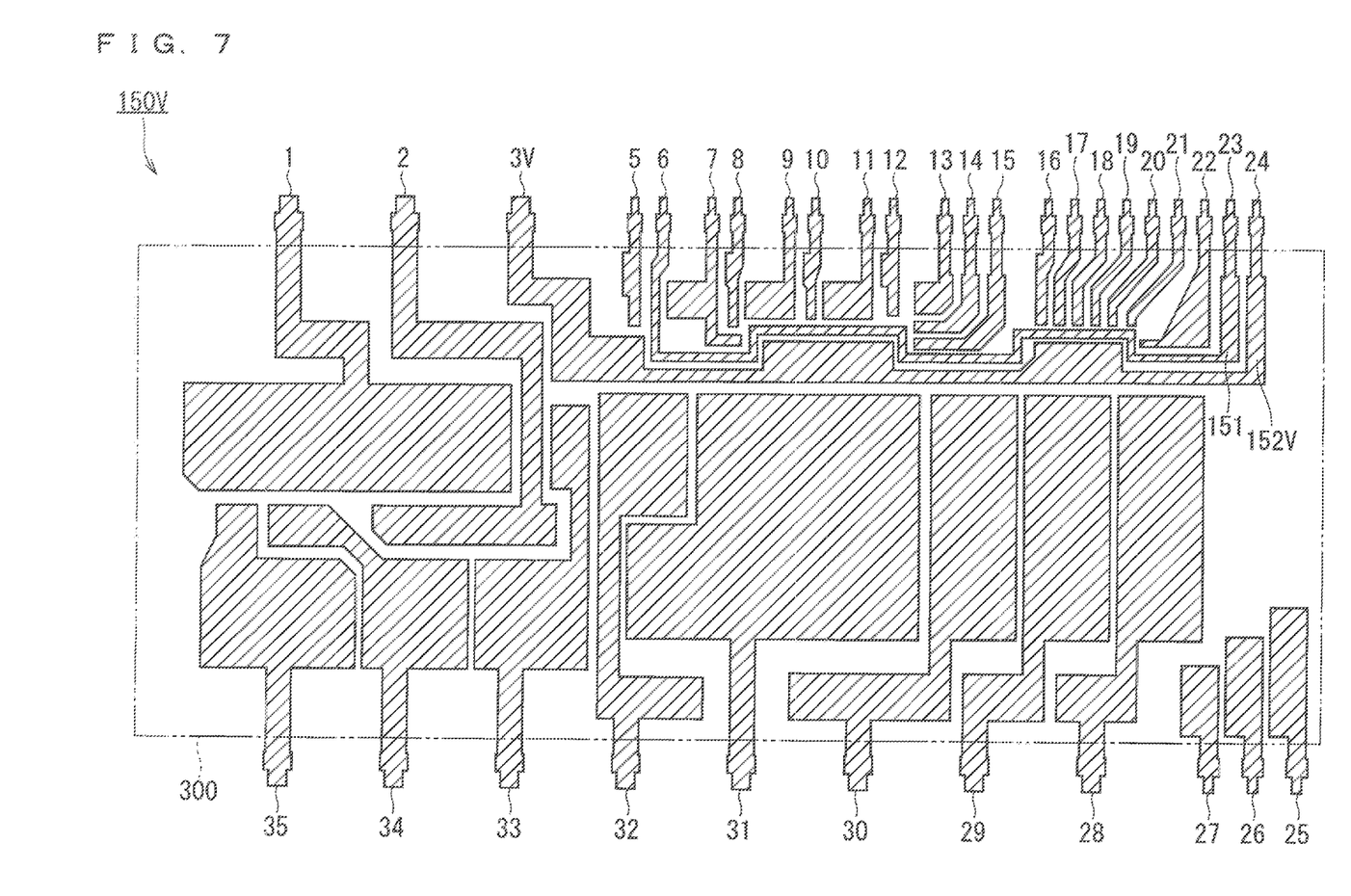
FIG. 7 is a plan view schematically illustrating a structure of metal portions in FIG. 5.

FIG. 5 is a plan view schematically illustrating a structure of an intelligent power module 900V (power semiconductor device) according to Embodiment 2. The dotted line in FIG. 5 indicates only an outer edge of the sealing resin 300. FIG. 6 is a circuit diagram schematically illustrating the structure of the intelligent power module 900V. FIG. 7 is a plan view schematically illustrating a structure of metal components 150V of the intelligent power module 900V in the same view as FIG. 5. FIG. 7 is hatched to facilitate viewing of the drawing.

The intelligent power module 900V includes the metal components 150V (FIG. 7) as a replacement for the metal components 150 (FIG. 3). The metal components 150V include a second metal component 152V as a replacement for the second metal component 152. The second metal component 152V is supported by the sealing resin 300 with a portion embedded in the sealing resin 300. The second metal component 152V is electrically connected to each of the LVIC inverter-control-system ground terminal 712, the HVIC inverter-control-system ground terminal 752, the brake-control-system ground terminal 812, and an emitter terminal of the IGBT 59 (ground side of the brake circuit 800). The second metal component 152 includes a plurality of protrusions protruding from the sealing resin 300 which constitute the inverter-unit-control ground external terminal 24 and the brake ground external terminal 3V. With this structure, the brake circuit 800 is grounded at the second metal component 152V in the sealing resin 300. The second metal component 152V does not include the brake-unit-control ground external terminal 4 (FIG. 3) unlike the second metal component 152.

Since the structures other than above are almost the same as those according to Embodiment 1, the same reference numerals denote the same or corresponding elements and the description thereof will not be repeated.

According to Embodiment 2, the protrusions of the metal component 152V from the sealing resin 300 include two protrusions of the inverter-unit-control ground external terminal 24 and the brake ground external terminal 3V that is an external terminal of the brake circuit 800. Consequently, the second metal component 152V can also be disposed in the sealing resin 300 with high accuracy similarly as the second metal component 152 (Embodiment 1).

The LVIC inverter-control-system ground terminal 712, the HVIC inverter-control-system ground terminal 752, the brake-control-system ground terminal 812, and the emitter terminal of the IGBT 59 are also short-circuited by the second metal component 152V in the sealing resin 300 according to Embodiment 2. Any one of the inverter-unit-control ground external terminal 24 and the brake ground external terminal 3V can supply the reference potential to the inverter circuit 700 and the brake circuit 800 (FIG. 2) accordingly. Any one of the inverter-unit-control ground external terminal 24 and the brake ground external terminal 3V also enables the brake circuit 800 to be grounded. Thus, it is possible to select whether the inverter-unit-control ground external terminal 24 or the brake ground external terminal 3V is used in manufacturing a device (not illustrated) on which the intelligent power module 900V is to be mounted, to be suitable for the wiring around the intelligent power module 900V or arrangement of the parts. Consequently, the flexibility in designing the wiring around the intelligent power module 900V or the arrangement of the parts will be improved.

The second metal component 152V does not include the brake-unit-control ground external terminal 4 (FIG. 1, Embodiment 1), thus indicating elimination of the brake-unit-control ground external terminal 4 in the intelligent power module 900V. Thus, the number of the external terminals of the intelligent power module 900V can be reduced. The intelligent power module 900V can be miniaturized accordingly.

Although each of Embodiments describes application of the IGBTs as switching elements, other semiconductor switching elements, for example, a metal-insulator-semiconductor field-effect transistor (MISFET) may be used.

Embodiments can be freely combined, and appropriately modified or omitted within the scope of the invention. Although this invention has been described in detail, the description is in all aspects illustrative and does not restrict the invention. Thus, numerous modifications that have yet been exemplified will be devised within the scope of the invention.

Explanation of Reference Signs 1 positive-output external terminal, 2 negative-output external terminal, 3 brake ground external terminal, 4 brake-unit-control ground external terminal, 5 brake control-input external terminal, 6 brake-unit-control power-supply external terminal, 7-12, 19-22 external terminal, 13-15 high-side control-input external terminal, 16-18 low-side control-input external terminal, 23 inverter-unit-control power-supply external terminal, 24 inverter-unit-control ground external terminal, 25-27 negative-connection external terminal, 28-30 AC-output external terminal, 31 positive-input external terminal, 32 brake external terminal, 33-35 AC-input external terminal, 41-46 converter diode, 150f frame, 51-56 IGBT (inverter switching element), 59 IGBT (brake switching element), 61-66 free-wheeling diode, 69 diode, 71-73 bootstrap diode, 81-83 bootstrap resistor, 150, 150V metal component, 150P flamed metal component, 151 first metal component, 152, 152V second metal component, 200 bond-wire, 300 sealing resin, 600 converter circuit, 700 inverter circuit, 710 inverter LVIC (inverter-control element), 711 LVIC inverter-control-system power-supply terminal, 712 LVIC inverter-control-system ground terminal, 721-723 LVIC inverter-control-input terminal, 730 element terminal, 741-743 LVIC inverter-control-output terminal, 750 inverter HVIC (inverter-control element), 751 HVIC inverter-control-system power-supply terminal, 752 HVIC inverter-control-system ground terminal, 764-766 HVIC inverter-control-input terminal, 771 driving-power-supply terminal, 772 driving-power-supply ground terminal, 784-786 HVIC inverter-control-output terminal, 794-796 offset-output terminal, 800 brake circuit, 810 brake control IC (brake control element), 811 brake-control-system power-supply terminal, 812 brake-control-system ground terminal, 829 brake control-input terminal, 839 brake control-output terminal, 900, 900V intelligent power module (power semiconductor device), 1000 mold, 1001 lower mold, 1002 upper mold, 1100 cavity.

The invention claimed is:

1. A power semiconductor device, comprising:
    at least one inverter switching element that is a switching element included in an inverter circuit;
    a brake switching element that is a switching element included in a brake circuit, said brake circuit also including a brake control element and a diode;
    at least one inverter-control element including an inverter-control-system power-supply terminal, said inverter-control element operating with a power-supply potential supplied to said inverter-control-system power-supply terminal to output a signal for controlling said inverter switching element;
    said brake control element including a brake-control-system power-supply terminal, said brake control element operating with the power-supply potential supplied to said brake-control-system power-supply terminal to output a signal for controlling said brake switching element;
    a sealing resin sealing said inverter switching element, said brake switching element, said inverter-control element, and said brake control element; and
    a first metal component including a plurality of protrusions protruding from said sealing resin, said first metal component being supported by said sealing resin with a portion embedded in said sealing resin, and electrically connected to each of said inverter-control-system power-supply terminal and said brake-control-system power-supply terminal.

2. The power semiconductor device according to claim 1, wherein said at least one inverter-control element includes a plurality of inverter-control elements each including said inverter-control-system power-supply terminal, and said first metal component is electrically connected to each of said inverter-control-system power-supply terminals included in said plurality of inverter-control elements.

3. The power semiconductor device according to claim 1, further comprising a bondwire connecting said first metal component to each of said inverter-control-system power-supply terminal and said brake-control-system power-supply terminal, wherein
    said first metal component is only in contact with said sealing resin and said bondwires in said sealing resin.

4. The power semiconductor device according to claim 1, wherein
    said inverter-control element includes an inverter-control-system ground terminal to which a reference potential of said power-supply potential supplied to said inverter-control-system power-supply terminal is supplied, and said brake control element includes a brake-control-system ground terminal to which a reference potential of said power-supply potential supplied to said brake-control-system power-supply terminal is supplied,
    said power semiconductor device further comprising a second metal component including a plurality of protrusions protruding from said sealing resin, said second metal component being supported by said sealing resin with a portion embedded in said sealing resin, and electrically connected to each of said inverter-control-system ground terminal and said brake-control-system ground terminal.

5. The power semiconductor device according to claim 4, wherein said brake circuit is grounded at said second metal component in said sealing resin.

6. The power semiconductor device according to claim 1, wherein
    an anode of said diode is connected to a collector of said brake switching element.

7. The power semiconductor device according to claim 1, wherein
    each of said at least one inverter switching element is an IGBT and said brake switching element is an IGBT.

8. The power semiconductor device according to claim 1, wherein
    the power semiconductor device is a converter-inverter-brake power module.

* * * * *